United States Patent
Wong et al.

(10) Patent No.: US 8,116,102 B2
(45) Date of Patent: Feb. 14, 2012

(54) INTEGRATED CIRCUIT DEVICE AND METHOD OF PRODUCING

(75) Inventors: Chee Peng Wong, Sembilan (MY); Tiam Sen Ong, Melaka (MY); Guan Choon Tee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 426 days.

(21) Appl. No.: 11/964,241

(22) Filed: Dec. 26, 2007

(65) Prior Publication Data

US 2009/0168388 A1     Jul. 2, 2009

(51) Int. Cl.
*H05K 5/02* (2006.01)

(52) U.S. Cl. ............... 361/813; 361/104; 361/306.1; 361/760; 361/809; 174/529; 174/536; 29/827; 29/884; 439/92; 439/76.1; 439/885; 257/676; 257/691

(58) Field of Classification Search ............ 361/813, 361/104, 306.1, 760, 809; 174/529, 536; 29/827, 884; 439/92, 76.1, 885; 257/676, 257/691

See application file for complete search history.

(56) References Cited

U.S. PATENT DOCUMENTS

| | | | | |
|---|---|---|---|---|
| 4,128,024 A | * | 12/1978 | Hyams et al. ............... 81/3.8 |
| 4,296,398 A | * | 10/1981 | McGalliard ............... 337/297 |
| 4,323,293 A | * | 4/1982 | DeRouen et al. ............ 439/76.1 |
| 4,347,745 A | * | 9/1982 | Singh ............... 73/721 |
| 4,411,361 A | * | 10/1983 | Mentzer ............... 206/716 |
| 4,571,662 A | * | 2/1986 | Conquest et al. ............ 361/306.1 |
| 4,571,664 A | * | 2/1986 | Hyland ............... 361/540 |
| 4,643,510 A | * | 2/1987 | Urani ............... 439/830 |
| 4,673,837 A | * | 6/1987 | Gingerich et al. ............ 310/239 |
| 4,798,546 A | * | 1/1989 | Herbert ............... 439/830 |
| 4,895,536 A | * | 1/1990 | Gingerich et al. ............ 439/885 |
| 5,057,901 A | | 10/1991 | Abel et al. |
| 5,115,298 A | * | 5/1992 | Loh ............... 257/691 |
| 5,142,765 A | | 9/1992 | Tanaka |
| 5,184,285 A | | 2/1993 | Murphy et al. |
| 5,196,374 A | | 3/1993 | Hundt et al. |
| 5,200,364 A | * | 4/1993 | Loh ............... 29/827 |
| 5,246,389 A | * | 9/1993 | Briones ............... 439/620.1 |
| 5,294,829 A | | 3/1994 | Hundt |
| 5,353,199 A | * | 10/1994 | Ohashi ............... 361/809 |
| 5,391,098 A | * | 2/1995 | Ohashi ............... 439/830 |
| RE35,109 E | * | 12/1995 | Kubota et al. ............... 257/676 |
| 5,578,126 A | * | 11/1996 | Taga et al. ............... 118/500 |

(Continued)

FOREIGN PATENT DOCUMENTS

JP     8139256     5/1996

OTHER PUBLICATIONS

Maxim, Application Note 762 of Maxim Report, Design and Manufacture of Automotive Pressure Sensors, 11 pages, Jun. 29, 2001.

*Primary Examiner* — Xiaoliang Chen (74) *Attorney, Agent, or Firm* — Dicke, Billig & Czaja, PLLC (57) ABSTRACT

An electronic device which comprises a lead frame comprising at least one clip, a capacitor comprising at least one terminal, the at least one terminal being received in the at least one clip, and a semiconductor chip attached to the lead frame.

19 Claims, 9 Drawing Sheets

U.S. PATENT DOCUMENTS

| | | | |
|---|---|---|---|
| 5,686,162 A * | 11/1997 | Polak et al. | 428/76 |
| 6,030,684 A * | 2/2000 | Polak et al. | 428/76 |
| 6,254,715 B1 * | 7/2001 | Okazaki et al. | 156/280 |
| 6,393,922 B1 * | 5/2002 | Winterer | 73/754 |
| 6,430,034 B2 * | 8/2002 | Sano et al. | 361/528 |
| 6,473,291 B1 * | 10/2002 | Stevenson | 361/306.3 |
| 6,486,535 B2 * | 11/2002 | Liu | 257/666 |
| 6,519,135 B2 * | 2/2003 | Sano et al. | 361/510 |
| 6,531,765 B2 * | 3/2003 | Kinsman | 257/676 |
| 6,611,051 B2 * | 8/2003 | Akiyama et al. | 257/685 |
| 6,707,146 B2 * | 3/2004 | Terui et al. | 257/691 |
| 6,732,590 B1 * | 5/2004 | Gottlieb et al. | 73/754 |
| 6,853,063 B2 * | 2/2005 | Akiyama et al. | 257/685 |
| 6,911,353 B2 * | 6/2005 | Tani et al. | 438/68 |
| 6,974,724 B2 * | 12/2005 | Hyvonen et al. | 438/107 |
| 6,974,909 B2 * | 12/2005 | Tanaka et al. | 174/529 |
| 7,057,277 B2 * | 6/2006 | Chen et al. | 257/707 |
| 7,061,103 B2 * | 6/2006 | Chen et al. | 257/713 |
| 7,064,442 B1 * | 6/2006 | Lane et al. | 257/773 |
| 7,091,588 B2 * | 8/2006 | Akiyama et al. | 257/685 |
| 7,102,211 B2 * | 9/2006 | Ochiai et al. | 257/666 |
| 2005/0108875 A1 * | 5/2005 | Mathieu et al. | 29/852 |
| 2005/0207939 A1 * | 9/2005 | Roussi et al. | 422/68.1 |
| 2007/0123073 A1 * | 5/2007 | Xiaochun | 439/92 |
| 2007/0151366 A1 * | 7/2007 | McDonald et al. | 73/861.63 |
| 2007/0277623 A1 * | 12/2007 | McDonald et al. | 73/861.63 |

* cited by examiner

INTEGRATED CIRCUIT DEVICE AND METHOD OF PRODUCING

BACKGROUND

This application relates to an electronic device and a method of producing the electronic device.

In a known electronic device, there is provided a semiconductor chip for signal processing. The semiconductor chip is mounted onto a lead frame of the electronic device and is also encapsulated by a molding compound for protecting the semiconductor chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
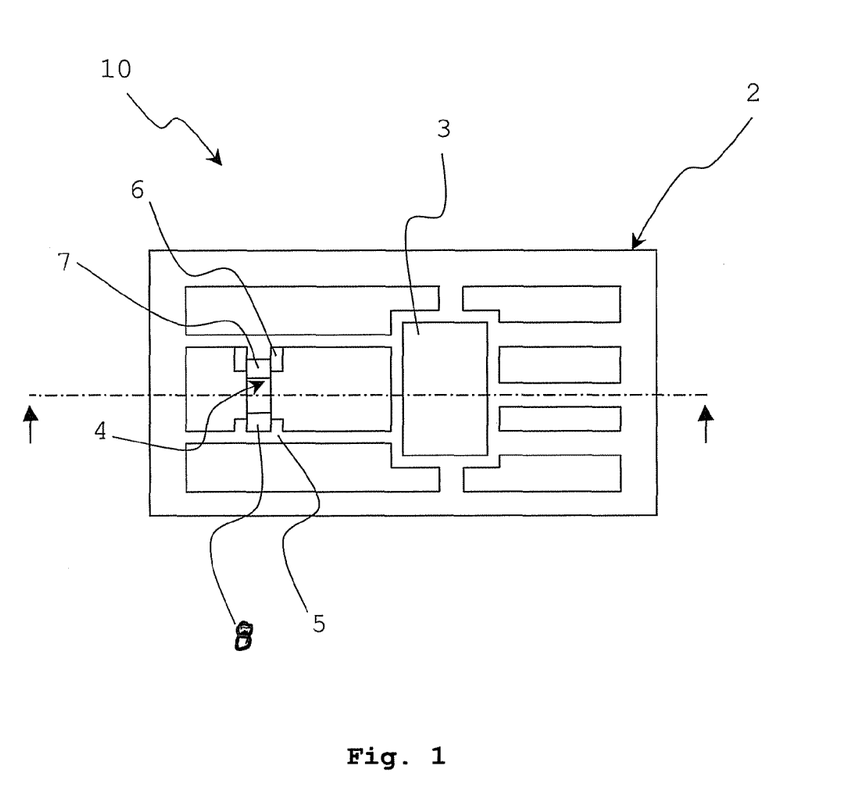
FIG. 1 illustrates a top view of an embodiment of an electronic device.

FIG. 1 illustrates a top view of an embodiment of an integrated circuit electronic device 10.

The electronic device 10 includes a semiconductor chip 3 with an external capacitor 4 on a lead frame 2. The semiconductor chip 3 is placed on the lead frame 2. The capacitor 4 is mounted on the lead frame 2, which is therefore provided with a mounting base 5 and with a first clip 6. The mounting base 5 is closely attached to the capacitor 4. The first clip 6 extends upwards from the lead frame 2. This is better seen in FIG. 2, which illustrates a side view of the electronic device 10 of FIG. 1.

Figure 2:
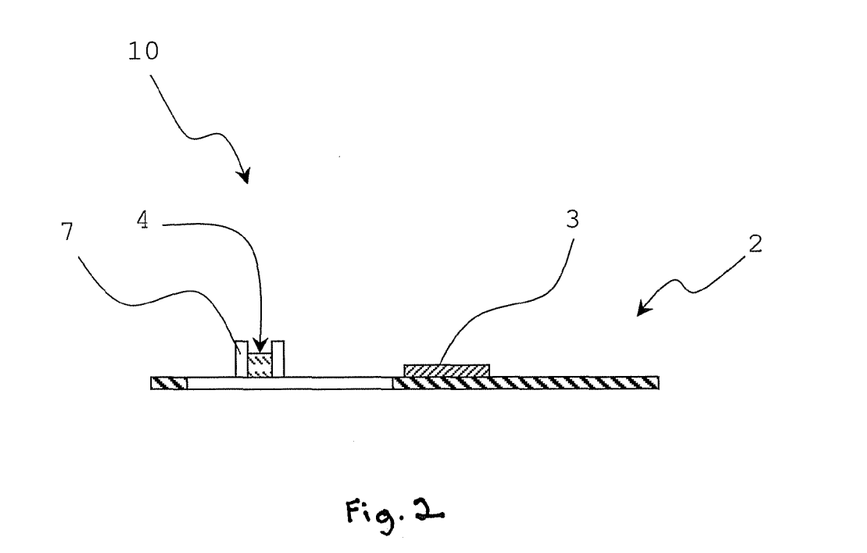
FIG. 2 illustrates a side view of the electronic device of FIG. 1.

The mounting base 5 and the first clip 6 are integrally formed with the lead frame 2. The first clip 6 holds the capacitor 4 to the lead frame 2, whilst the mounting base 5 supports the capacitor 4. The mounting base 5 further electrically connects the lead frame 2 to a first terminal 7 of the capacitor 4, whilst the first clip 6 electrically connects the lead frame 2 to a first terminal 7 of the capacitor 4.

In one embodiment, the capacitor 4 provides electric power to the semiconductor chip 3 when external power supply to the semiconductor chip 3 is interrupted. The external power supply can be interrupted by mechanical shocks, vibrations or electromagnetic interferences. Hence, the semiconductor chip 3 maintains continuous electronic operation based on electric power supply from the capacitor 4 when interruptions of the external power supply occur.

The capacitor 4 is an electronic component with large structures that cannot be integrated into the semiconductor chip 3. The embodiment provides stable mechanical structures and electrical connections that couple the large capacitor 4 to the semiconductor chip 3, thereby providing continuous electronic operation of the electronic device 10.

During manufacturing processes of the electronic device 10, the lead frame 2 is firstly provided. The capacitor 4 is later clip fastened to the first clip 6. The semiconductor chip 3 is further connected to the lead frame 2.

Although the clip fastening of the embodiment can couple the capacitor 4 to the lead frame 2 effectively, it is possible to use epoxy material for mechanically holding and electrically connecting the capacitor 4 to the lead frame 2. When the epoxy material is used, there are several extra manufacturing processes required. A first process is an epoxy dispensing process in which the epoxy material is dispensed onto areas of a lead frame by an epoxy dispensing unit. The following process is a capacitor bonding process in which the capacitor is put onto the epoxy material dispensed areas. A curing process is the third process, in which epoxy material between the capacitor and the lead frame is cured in an oven for a predetermined period of time. The curing process is also called a pre-molding process. The subsequent fourth process is a molding process in which the capacitor is encapsulated for increasing package rigidity. The resulting device is further cured in an oven to enhance package rigidity, which is the fifth process of post-molding curing process.

Instead of bonding the capacitor to the lead frame with epoxy material, the embodiment of FIG. 1 and FIG. 2 uses one single clip fastening process which is simple to implement. Dispensing of epoxy material to the first terminal 7 is optionally possible for manufacturing the electronic device 10, but the embodiment of FIG. 1 and FIG. 2 avoids that for several reasons. The epoxy dispensing process would require precision in machine control which can escalate cost of manufacturing machinery. Furthermore, the epoxy dosing and its related manufacturing processes usually would involve complicated and detailed process instructions for operators and service technicians. Setting up of an epoxy material dispensing system would also be time consuming and require skill.

The process of clip fastening improves quality and reliability of the electronic device 10. This is because the clip fastening of the embodiment provides reliable mechanical holding and electrical connection to the capacitor 4. Furthermore, manufacturing lead-time and cycle-time of the embodiment can be made short. Time consuming curing processes and encapsulation process related to the epoxy material application are not necessary for the clip fastened embodiment process. When the epoxy material would be additionally used, any weak bonding of the epoxy material does not affect quality and reliability of the clip fastened capacitor.

Short-circuiting between the first terminal 7 and the second terminal 8 is prevented in the embodiment. The epoxy material is not required for providing electrical connection between the lead frame 2 and the capacitor 4 in the embodiment. As an extra process, electrically conductive epoxy material could still be applied to the first terminal 7 and to the second terminal 8 of the capacitor 4 for connecting the capacitor 4 to the lead frame 2. Poor or wrong parameters for setting up an epoxy material dispensing machine could then cause short-circuiting problem. The epoxy material might be mistakenly pasted or overflowed onto a middle part of the capacitor such that the epoxy material could bridge the first terminal and the second terminal. The embodiment avoids these problems by providing the clip fastened electrical and mechanical connections between the capacitor 4 and the lead frame 2.

The manufacturing process for making the electronic device 10 increases product quality of the embodiment. The embodiment of FIG. 1 and FIG. 2 further reduces machine setup time and schedule down time by using the clip fastening process. This is because a misaligned capacitor can be corrected to a proper position by resilience of the first clip 6.

In the case that the epoxy material would optionally be used for bonding the capacitor to the lead frame, there is extra machine setup time and scheduled down time provided for ensuring proper pasting of the epoxy material to the mounting base 5 and to the first clip 6. A multi-vision system would therefore also be required for post bond inspection of an epoxy pasted capacitor. The embodiment of FIG. 1 and FIG. 2 can be produced without using such an expensive system.

The embodiment also provides a reduced machine idle time for making the electronic device 10. This is because clip fastening of the capacitor 4 provides a short waiting time between manufacturing consecutive electronic devices 10 on a production line.

When epoxy material would be used as an extra process, the process of pre-molding prolongs overall lead-time of the electronic device. Incomplete molding of the capacitor could also occur. The molding process would then be a bottleneck for the process of epoxy material application. The embodiment of FIG. 1 and FIG. 2 thus increases product yield and reduces customer incidents because no epoxy material is used for coupling the capacitor 4 to the lead frame 2.

The embodiment also does not require epoxy post-molding inspection for the clip fastened capacitor 4, which is beneficial for further decreasing product lead-time and material handling cost of the electronic device 10. When the epoxy material is optionally used, the process of post-molding inspection would be needed after the bonding process with the epoxy material. The process of post-molding inspection is provided for detecting incomplete molding of the epoxy material in the post-molding process. Additional time and machinery cost would then be required for the post-molding inspection.

The embodiment of FIG. 1 and FIG. 2 requires no encapsulation of the clip fastened capacitor 4 because the mechanical coupling between the capacitor 4 and the lead frame 2 is robust. The clip fastened capacitor 4 qualifies for Moisture Sensitivity Level (MSL) one. The capacitor 4 is inert to plating during later manufacturing processes so that encapsulation is not needed for protecting the capacitor 4 during the plating process. The capacitor 4 can even be replaced in a later maintenance process, which would be difficult when an extra epoxy material application process is provided.

The lead frame 2 provides a supporting structure for mounting the semiconductor chip 3. The lead frame 2 can be provided as a metal frame or as a metal structure. Various forms are taken by the lead frame 2 at different stages of manufacturing process. At a beginning stage, the lead frame 2 is in a metal sheet form with punched holes. The lead frame 2 has a number of lead fingers and a die pad at an intermediate stage. The lead fingers can be used for external electrical connections, whilst the die pad is provided for supporting the semiconductor chip 3. Tie bars with a predetermined geometry are provided for holding parts of the lead frame 2 together during the intermediate stage. At a final stage, the lead frame 2 is further provided with bent lead fingers and detached parts after the tie bars are being cut off.

The capacitor 4 is a form of passive electronic components. Examples of the passive components are capacitors, resistors, diodes, etc. In contrast, examples of active components are batteries.

The semiconductor chip 3 can be replaced by a micro-electro mechanical system (MEMS) or by a nano-electromechanical system (NEMS). The first clip 6 can have different forms or mechanical equivalents, such as a clamp, a clasp or a catch, for fastening the capacitor 4. The capacitor 4 can be in a form of an electrolytic capacitor, a tantalum capacitor, a ceramic capacitor, a polyester film capacitor, a polystyrene film capacitor, a metalized polyester film capacitor, an electric double layer capacitor, a polypropylene capacitor, a mica capacitor, or a chip capacitor.

Figure 3:
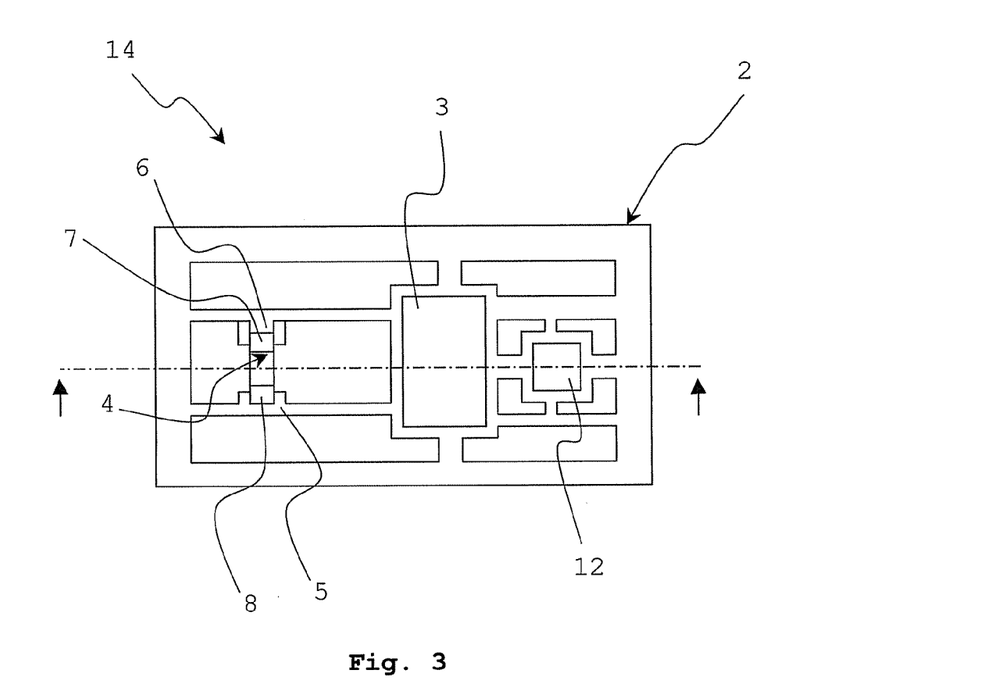
FIG. 3 illustrates an exposed top view of a further embodiment of an electronic device with a transducer.

FIG. 3 illustrates an exposed top view of a further embodiment of an electronic device 14 with a transducer 12. The electronic device 14 has parts with similar structures and functions as compared to the electronic device 10 of FIG. 1 and 2. The similar parts are labeled with same reference numerals. Relevant descriptions are hereby incorporated by reference. In addition to the similar parts, the semiconductor device 14 further include the transducer 12 for sensing an environmental factor, such as pressure, temperature, and force, etc. The transducer 12 is placed on the lead frame 2 and is also electrically connected to the semiconductor chip 3 of the semiconductor device 14. The transducer 12 converts received energy of the environmental factor to an electrical signal that is processed by the semiconductor chip 3 for sensing the environment. The semiconductor device 14 of FIG. 3 can also be called a sensor unit or a sensor.

Figure 4:
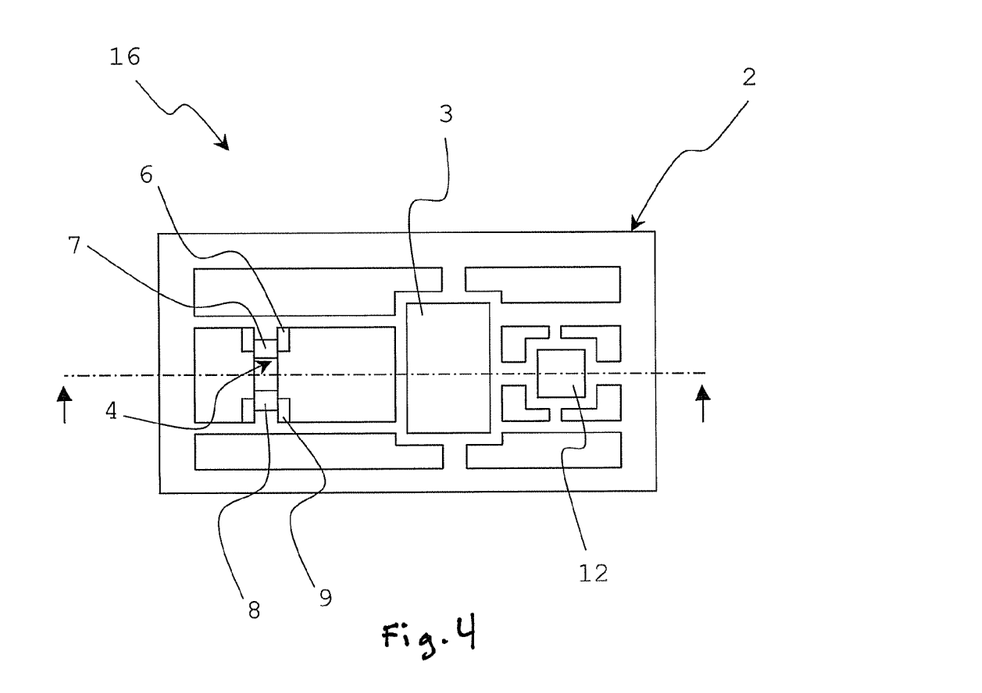
FIG. 4 illustrates an exposed top view of a further embodiment of an electronic device with a transducer and two clips.

FIG. 4 illustrates an exposed top view of a further embodiment of an electronic device 16 with a transducer 12 and two clips 6, 9. The electronic device includes parts that are similar to the parts of the previously described electronic devices 10, 14. The similar parts with similar reference numerals perform similar functions and are connected to each other with similar structures. Relevant descriptions of these similar parts are hereby incorporated by reference.

The electronic device includes a first clip 6 and a second clip 9. The first clip 6 and the second clip 9 are provided for clip fastening a first terminal 7 of the capacitor 4 and the second terminal 8 of the capacitor 4 respectively. The first clip 6 and the second clip 9 also electrically connect to the first terminal 7 and the second terminal respectively. The first clip 6 and the second clip 9 provide reliable and robust locking structure for securing and connecting the first terminal 7 and the second terminal 8 because the capacitor 4 is clip fastened at its two ends. The first clip 6 and the second clip 7 also conveniently provide different electrical polarity to the terminals 7, 8 of the clip fastened capacitor 4.

Figure 5:
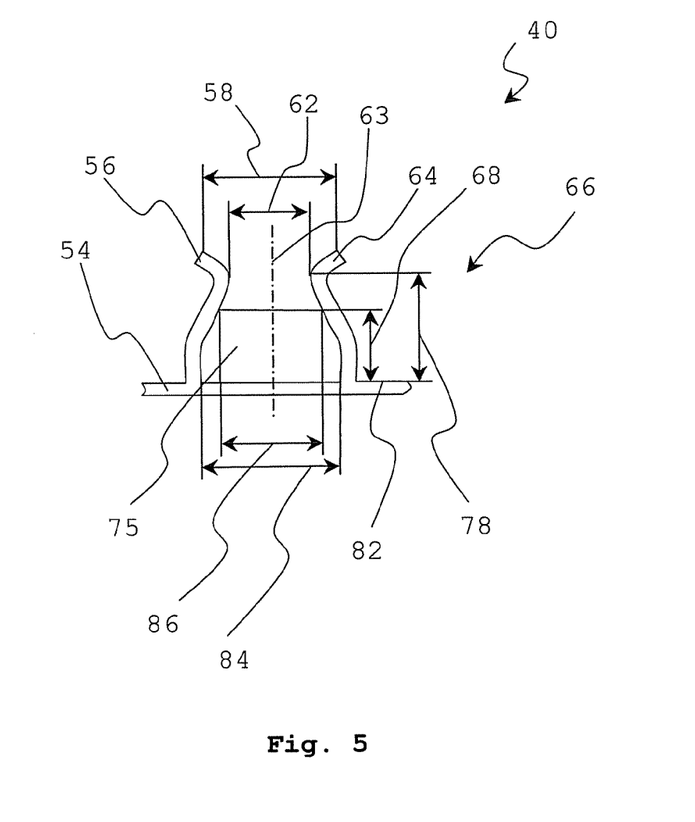
FIG. 5 illustrates a front view of a pair of curve-profiled clips with a storage capacitor.
Figure 6:
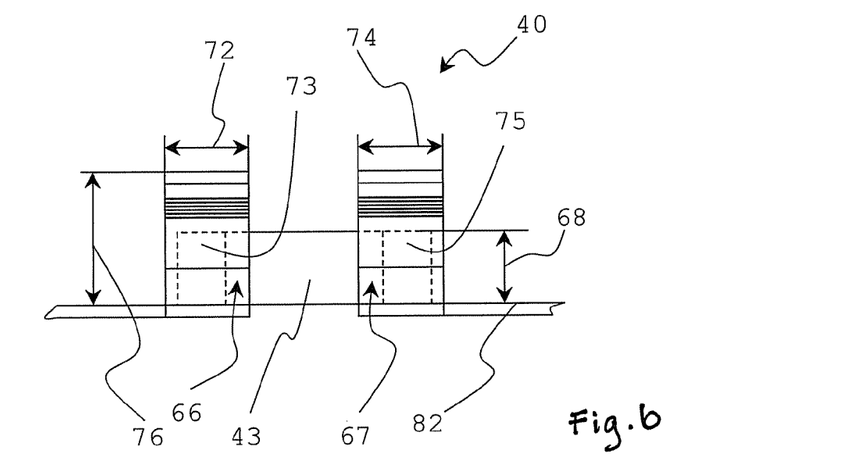
FIG. 6 illustrates a side view of the pair of clips and the storage capacitor of FIG. 5.
Figure 7:
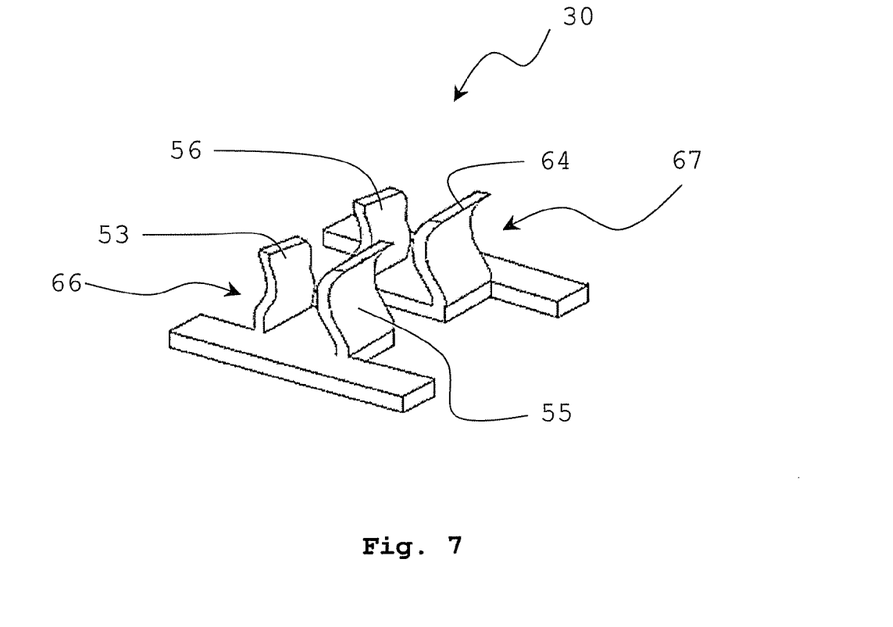
FIG. 7 illustrates a perspective view of the clips of FIG. 5 and FIG. 6.

Detailed features of the first clip 6 and the second clip 9 are provided by the first curve-profiled clip 67 and the second curve-profiled clip 66 respectively in relation to FIGS. 5-7. Further alternatives are described in relation to FIGS. 8-10.

FIG. 5 illustrates a front view of a pair of curve-profiled clips 66, 67 with a storage capacitor 43. The curve-profiled clips 30 can be as the first clip 6 for the electronic devices 10, 14 of FIGS. 1-4.

The storage capacitor 43, as an example, is placed inside a first curve-profiled clip 66 and a second curve-profiled clip 67, as can be best seen in FIG. 5. The curve-profiled clips 66, 67 in this embodiment provide an even easier and more reliable mounting of the capacitor 43, as will be illustrated in detail.

The clip fastened storage capacitor 43 includes a first terminal 75 and a second terminal 73. The first terminal 75 and the second terminal 73 are placed at opposite ends of the storage capacitor 43. The first curve-profiled clip 66 includes a first arm 56, a second arm 64, and a base 54. The first curve-profiled clip 66 and the second curve-profiled clip 67 have similar profiles and are spaced apart from each other, as can be seen in FIG. 6. The arms 56, 64 extend up-wards from a top surface 82 of the base 54 and are positioned apart. A cavity is formed by the arms 56, 64. The base 54 is integrally connected to the lead frame 2.

The arms 56, 64 of the clip 67 are symmetrical to each other with respect to a centerline 63. The centerline 63 extends in a longitudinal direction of the clip 67.

The curve-profiled arms 56, 64 together with the base 54 of the clip 67 form a profile, which can be seen in FIG. 5. The profile includes a mouth portion, a neck portion that is adjacent to the mouth portion, and a chest portion that is adjacent to the neck portion. Accordingly, upper portions, middle portions, and lower portions of the curved arms 56, 64 form the mouth portion, the neck portion, and the chest portion respectively. The mouth portion is also called upper portion. The neck portion is also called middle portion. The chest portion is also called lower portion.

A gap 58 of the mouth portion having a width in a lateral direction is greater than a width 86 of the first terminal 75 of the storage capacitor 43. Below the mouth portion, the middle portions of the arms 56, 64 bend inwardly to form the neck portion of the profile. A gap 62 of the neck portion is lesser than the width 86 of the first terminal 75 of the storage capacitor 43. Below the neck portion, the lower portions of the arms 56, 64 form the chest portion. A gap 84 of the chest portion that is near the base 54 having a width greater than the width 86 of the first terminal 75 of the storage capacitor 43.

FIG. 5 illustrates that a height 78 of the neck portion is greater than a height 68 of both the second terminal 73 and the first terminal 75. The storage capacitor 43 is uniform in height as illustrated in FIG. 5 and FIG. 6. The second terminal 73 and the first terminal 75 are clip fastened in a similar manner to the clips 66, 67 of the lead frame 2.

FIG. 6 illustrates a side view of the pair of clips 66, 67 and the storage capacitor 43 of FIG. 5. In the side view of FIG. 6, which corresponds to the front view of FIG. 5, the widths 72, 74 of the extended arms 56, 64 of the first curve-profiled clip 66 and the second curve-profiled clip 67 are equal. A height 76 of the clip 66 is defined by a height of the extending arm 56, 64 measured from the top surface 82 of the base 54 to tips of the arms 56, 64. Furthermore, the terminals 73, 75 of the storage capacitor 43 are grasped by the first curve-profiled clip 66 and the second curve-profiled clip 67 to the lead frame 26 respectively.

FIG. 7 illustrates a perspective view of the clips 66, 67 of FIG. 4 and FIG. 5 without the storage capacitor 43. The perspective view of FIG. 6 illustrates that a pair 30 of the first curve-profiled clip 66 and the second curve-profiled clip 67 is aligned along their openings and the first curve-profiled clip 66 and the second curve-profiled clip 67 forms an integral portion of the lead frame 38. Similar to the first curve-profiled clip 66, the second curve-profiled clip 67 has two curve-profiled arms 53, 55 with comparable profiles. The arm 53 is the first arm of the second curve-profiled clip 67, whilst the arm 55 is the second arm of the second curve-profiled clip 67.

The pair 30 of curve-profiled clips 66, 67 is provided for securing the storage capacitor 43 to a lead frame. Both the first curve-profiled clip 66 and the second curve-profiled clip 67 are made from a copper alloy sheet and their arms 56, 64, 53, 55 are resilient. The base 54 offers support to the terminals 73, 75 of the storage capacitor 43. Referring to the first curve-profiled clip 67 as an example, the wide-opening mouth portion can guide the first terminal 75 of the storage capacitor 43 into the chest portion of the clip 67. The neck portion prevents the clip fastened storage capacitor 43 from escaping towards the mouth portion. The width 74 of the arms 56, 64 are made slightly greater than a length of the first terminal 75 for providing reliable gripping. The arms 56, 64, 53, 55 of the first curve-profiled clip 66 and the second curve-profiled clip 67 also electrically connect the terminals 75, 73 to the lead frame 26 of FIG. 13 and FIG. 14.

The curve-profile of the clips 66, 67 helps to align the capacitor 43 when the capacitor 43 is being inserted into the clips 66, 67. The curve-profiled clips 66, 67 have mouth portions that are wider than the terminals 73, 75 of the capacitor 43. Furthermore, the neck portion of the curve-profiled clips 66, 67 are smooth so that the capacitor 43 does not experience large resistance during the clip fastening. The narrow neck portion further secures the inserted capacitor 43 onto the clips 66, 67.

In other words, no precision control is needed for the clip fastening. The clip fastening is performed with a simple insertion. Machine setup-time and schedule downtime are reduced. Moreover, the electronic circuit device 10 to be produced with increases quality.

Other forms of clips, which can be used for the electronic devices 10, 14 are described in relation to FIGS. 8-10 below.

Figure 8:
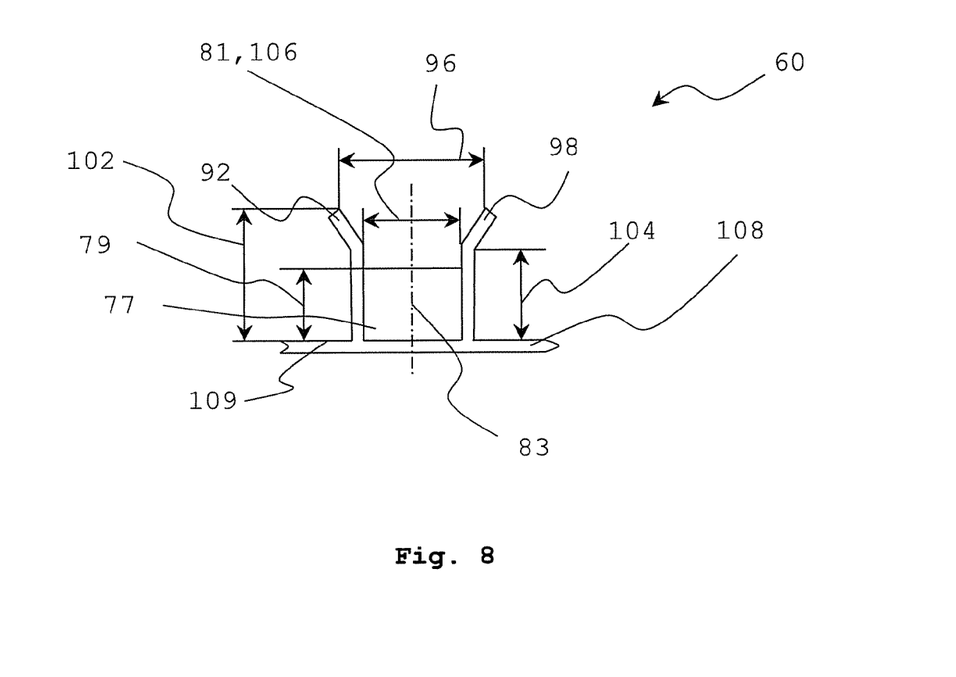
FIG. 8 illustrates a front view of a straight-profiled clip with a clip fastened storage capacitor.

FIG. 8 illustrates a front view of a further embodiment of a straight-profiled clip for clip fastening a storage capacitor 43.

The straight-profiled clip 60 includes parts that are similar to the parts of the curve-profiled clip 67 of FIGS. 5-7 and parts that have similar functions as the parts of the curve-profiled clip 67 of FIGS. 5-7. The description of FIGS. 5-7 is included here by way of reference, where appropriate. Such parts are denoted with similar names.

The straight-profiled clip 60 has a pair of arms 92, 98 extending upward from a top surface 109 of a base 108 of the clip 60 facing each other. The base 108 is an integral part of the lead frame 26. The two arms 92, 98 have similar profiles and are positioned apart to form a cavity. The arms 92, 98 are mostly symmetrical with respect to a centerline 83 that is provided in a middle position between the arms 92, 98 of the clip 60. Upper portions of the arms 92, 98 curve away from the centerline 83 and form a mouth portion of the straight-profiled clip 60 on top. A gap 96 of the mouth portion has a width greater than a width 81 of a second terminal 77 of a storage capacitor. Below the mouth portion of the straight-profiled clip 60, a neck portion and a chest portion formed by the arms 92, 98 have straight side portions perpendicular to the top surface 109. In other words, the neck portion and the chest portion of the straight-profiled clip 60 are mostly uniform in width and the width 81 of the neck portion and the width 106 of the chest portion is similar to a width 81 of the terminal 77. A height 104 of the neck portion and the chest portion is greater than a height 79 of the second terminal 77 of the storage capacitor. In other words, a height 102 of the arms 92, 98 is greater than the height 79 of the storage capacitor 43.

For interpreting the function of the embodiment illustrated in FIG. 8, one may also, by way of reference, refer to the explanations and remarks stated above with respect to the embodiment, which is illustrated in relation to the previous figures, where appropriate.

The mouth portion of the straight-profiled clip 60 is designed to guide the second terminal 77 of the storage capacitor into the straight-profiled clip 60 during insertion. The straight portions of the straight-profiled clip 60 has treated surfaces so that the arms 92, 98 provide sufficient friction to clutch an inserted storage capacitor as well as offer electrical contacts when a capacitor is clip fastened between the arms 92, 98. The treatment can be chemical treatment or mechanical roughening, etc. The straight portions have relatively larger areas for better contacting the second terminal 77. Hence, the storage capacitor is gripped and electrically connected. The base 108 provides support to the second terminal 77 of the clip fastened storage capacitor. The treatment of the arms 92, 98 may be roughening or coating the surface of the arms 92, 98.

Figure 9:
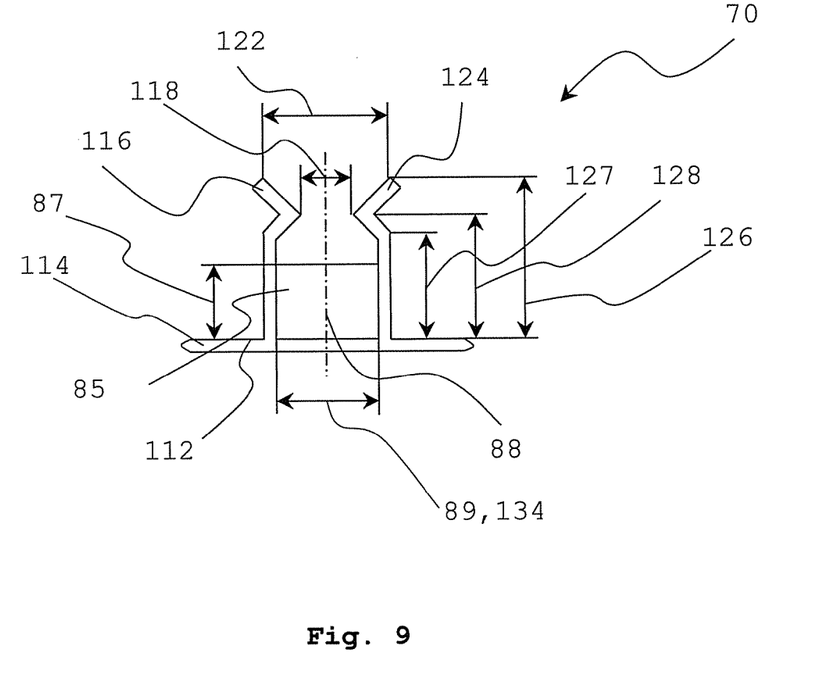
FIG. 9 illustrates a front view of a W-profiled clip with a clip fastened storage capacitor.

FIG. 9 illustrates a front view of an embodiment of a W-profiled clip 70 with a clip fastened storage capacitor.

The W-profiled clip 70 includes parts that are similar to the parts of the curve-profiled clip 67 of FIGS. 5-7, the straight-profiled clip 60 of FIG. 8, or parts that have similar functions as the parts of the curve-profiled clip 67 of FIGS. 5-7, or the straight-profiled clip 60 of FIG. 8. The description of FIGS. 5-7 and FIG. 8 is included here by way of reference, where appropriate. Such parts are denoted with similar names.

The W-profiled clip 70 has a pair of arms 116, 124 extending upwardly from a top surface 112 of a base 114 of the clip 70. The two arms 116, 124 are positioned apart and facing each other. The arms 116, 124 are mostly symmetrical with respect to a centerline 88 that is provided between the arms 116, 124 in a longitudinal direction. Upper portions of the arms 116, 124 curve away from each other to form a mouth portion opening towards top.

The mouth portion includes a gap 122 having a width greater than a width 89 of a second terminal 85 of a storage capacitor. Below the mouth portion, the arms 116, 124 of the W-profiled clip 70 bend inwardly towards each other such that a neck portion is formed whose gap 118 is lesser than the width 89 of the second terminal 85. Further below the neck portion, the arms 116, 124 of the W-profiled clip 70 are straight and perpendicular to a top surface 112 of the base 114. A chest portion is thus formed below the neck portion by the straight portions of the arms 118, 124. A lateral gap 134 of the chest portion at the base 114 of the W-profiled clip 70 has similar size compared to the width 89 of the terminal 85 of the storage capacitor. According to FIG. 9, a height 126 of the mouth portion is greater than a height 128 of the neck portion. The height 128 of the neck portion is greater than a height 127 of the chest portion. The height 127 of the chest portion is further greater than the height 87 of the second terminal 85 of the storage capacitor.

For interpreting the function of the embodiment illustrated in FIG. 9, one may also, by way of reference, refer to the explanations and remarks stated above with respect to the embodiments, which are illustrated in FIGS. 1-8, where appropriate.

A wide lateral gap 122 of the mouth portion, as provided here, can guide the second terminal 85 of the storage capacitor entering into the chest portion of the W-profiled clip 70 for clip fastening. A narrow lateral gap 118 at the neck portion can stop the clip fastened storage capacitor from evading. Since the straight portions 127 of the arms 116, 124 provide close contact with the second terminal 85 of the storage capacitor, friction force between the arms 116, 124 and the second terminal 85 of the storage capacitor can offer electrical connection as well as reliable mechanical grasping. The W-profiled clip 70 forms a robust and reliable locking structure for mechanically holding and electrically connecting an inserted capacitor.

The embodiment of FIG. 9 provides the clip 70 with resilient arms 116, 124, which in turn provides a locking structure a capacitor. The shape of the arms 116, 124 secures the capacitor onto the clip 70.

Figure 10:
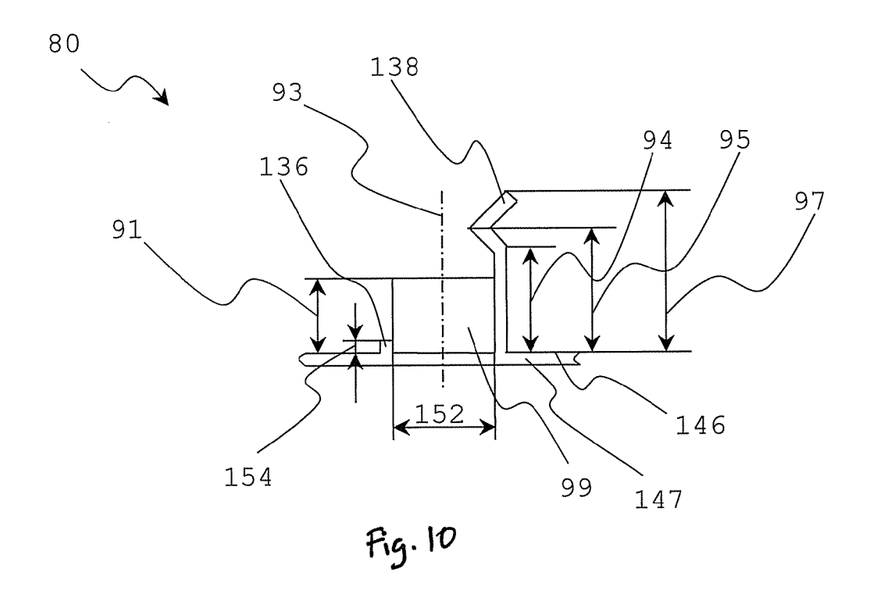
FIG. 10 illustrates a front view of an asymmetrical profiled clip with a clip fastened storage capacitor.

FIG. 10 illustrates a front view of an embodiment of an asymmetrical profiled clip 80 with a clip fastened storage capacitor.

The asymmetrical profiled clip 80 includes parts that are similar to the parts of the curve-profiled clip 67 of FIGS. 5-7, the straight-profiled clip 60 of FIG. 8, the W-profiled clip 70 of FIG. 9, or parts that have similar functions as the parts of the curve-profiled clip 67 of FIGS. 5-7, the straight-profiled clip 60 of FIG. 8, or the W-profiled clip 70 of FIG. 9. The descriptions of FIGS. 5-9 are included here by way of reference, where appropriate. Such parts are denoted with similar names.

On a right side of the symmetrical clip 80, there is an asymmetrical arm 138 extending vertically upward from a top surface 146 of a base 147 of the clip 80. On a left side of the symmetrical clip 67, there is a stopper 136 protruding upward from the top surface 146. The asymmetrical arm 138 and the stopper 136 are positioned at equal distance away from a centerline 93 that is provided at a middle position between the stopper 136 and the asymmetrical arm 138. A cavity is formed between the stopper 136 and the asymmetrical arm 138.

The asymmetrical arm 138 of the asymmetrical profiled clip 80 has similar configuration of the second arm 124 of the W-profiled clip 70 illustrated in FIG. 9. In other words, the asymmetrical arm 138 of the asymmetrical profiled clip 80 presents at a right side of the asymmetrical profiled clip 80 with a wide opening mouth portion on top, a narrower neck portion in middle, and a chest portion at bottom. Since there is no symmetrical arm provided on the left side of the centerline 93, a gap of the neck portion of the asymmetrical clip 80 is twice the distance measured from the right arm 138 to the centerline 93. The width of a gap of a mouth portion of the asymmetrical clip 80 is twice the distance measured from a tip of the right arm 138 to the centerline 93. A gap of the chest portion of the asymmetrical clip 80 is twice the distance measured from a bottom of the asymmetrical arm 138 on the right side to the centerline 93. The gap 152 of the chest portion is similar to a width of a second terminal of a clip fastened storage capacitor. Also illustrated in FIG. 10, a height 154 of the stopper 136 is less than a height 91 of the second terminal 99 of the storage capacitor. A height 97 of the mouth portion is greater than a height 95 of the neck portion. The height 95 of the neck portion is greater than a height 94 of the chest portion.

For interpreting the function of the embodiment illustrated in FIG. 10, one may also, by way of reference, refer to the explanations and remarks stated above with respect to the embodiments, which are illustrated in FIGS. 1-9, where appropriate.

The stopper 136 prevents the inserted storage capacitor from moving away when the second terminal 99 of the storage capacitor experiences biasing force from the asymmetrical arm 138 in cooperation with the stopper 136. Since the asymmetrical arm 138 is made resilient, the inserted storage capacitor can be gripped tightly by the asymmetrical arm 138 and the stopper 136 inside the chest portion of the clip 80. The asymmetrical arm 138 and the stopper 136 further connect the second terminal 99 to a lead frame electrically.

Figure 11:
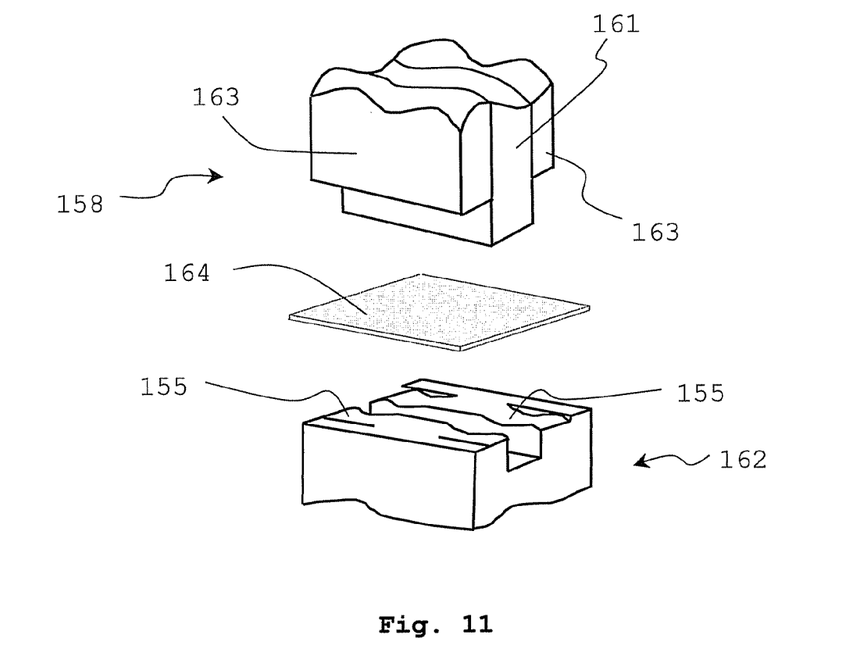
FIG. 11 illustrates an embodiment of a copper alloy sheet located between a pair of straight-forming dies for stamping arms of a straight-profiled clip.
Figure 12:
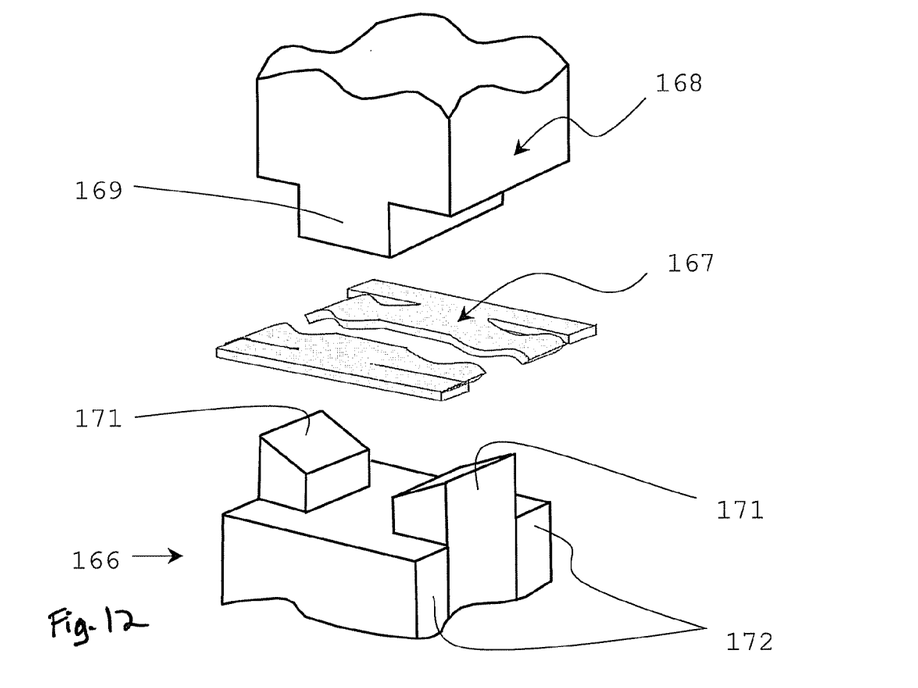
FIG. 12 illustrates an embodiment of a perforated copper alloy sheet between a pair of arm-bending dies for bending the arms of the straight-profiled clips.

In order to adopt the capacitor clip fastening method, clips are pre-formed on a lead frame. FIG. 11 and FIG. 12 illustrate a sequence of processes for forming clips which can be used to clip fastening a passive electronic component, such as a capacitor. FIG. 11 and 12 gives an embodiment for providing the straight-profiled clip 60. The embodiment of FIG. 11 and 12 only require two tools for punching and bending respectively.

FIG. 11 illustrates an embodiment of a copper alloy sheet 164, which is located between a pair of straight-forming dies 158, 162 for stamping arms of the straight-profiled clip 60 of FIG. 8. The pair of straight-forming dies 158, 162 is in vertical alignment. A top straight-forming die 158 includes a straight-profiled head 161 between two contiguous shoulders 163. The two shoulders 163 of the top straight-forming die 158 have slot-formed bottom surfaces, which are symmetrical with respect to the head 161. The head 161 is moveable in a vertical direction with respect to the shoulders 163. The top straight-forming die 158 is movable in a vertical direction. Correspondingly, a bottom straight-forming die 162 has a slot receivable for the head 161. The bottom straight-forming die 162 has two elevations 155 with compliment Wd profiles to the shoulders' 163 bottom surfaces.

FIG. 12 illustrates an embodiment of a perforated copper alloy sheet between a pair of arm-bending dies 168, 166 for bending arms of the pair of straight-profiled clip 60. In FIG. 12, the pair of arm-bending dies 166, 168 is aligned vertically. The top arm-bending die 168 has a protruding tongue 169 with a straight bottom surface in a middle position. The top arm-bending die 168 is movable in a vertical direction. The bottom arm-bending die 166 is placed below the top arm-bending die 168. The bottom arm-bending die 166 includes a base 172 and two raised blocks 171 at two sides to match the W-formed profiles on their top respectively. The two raised blocks 171 are movable in a vertical direction with respect to the base 172.

During stamping, a copper alloy sheet 164 is fed into a gap between the straight-forming dies 158, 162. The shoulders 163 of top straight-forming die 158 come down first and meet the elevations of the bottom straight-forming die 162 such that the copper alloy sheet 164 is clamped tightly. Following the clamping, the head 161 of the top straight-forming die 158 descends and punch a middle portion off the copper alloy sheet 164. Upon coming closer to a bottom surface of the slot of the bottom straight-forming die 162, the head 161 retreats upward and the whole top straight-forming die 158 ascends back to an initial position as illustrated in FIG. 11. As a result, side portions of the copper alloy sheet 164 are stamped and follow Ws of the elevations 155 of the bottom straight-forming die 162 with a perforation in middle. The perforated copper alloy sheet, as a part of a lead frame, is ejected out of the dies 158, 162 for a next process as presented in FIG. 12. The perforated copper alloy sheet 167 is known as a curve-formed copper alloy sheet.

During arm bending, the curve-formed copper alloy sheet 167 is inserted between the arm-bending dies 166, 168 and placed on top of the base 172. At this situation, two raised blocks 171 are below the base 172 such that the copper alloy sheet 167 is not contacted by the raised blocks 171. The top arm-bending die 168 descends first and the protruding tongue 169 of the top arm-bending die 168 touches the bottom arm-bending die 166 such that the perforated copper alloy sheet 167 is clamped tightly. Thereafter, two raised blocks 171 rise above a top surface of the base 172 so that the arms 92, 98 of the straight-profiled clip 60 are bent up. The arms 92, 98 of the straight-profiled clips 60 thus follow a profile of the bottom arm-bending die 166 in a profile illustrated in FIG. 12.

The stamping process of FIG. 11 and 12 may be modified to improve clip forming efficiency and accuracy. Other types of clips, such as those curve-profiled clips, W-profiled clips, asymmetrical-profiled clips, or other similar clips can be formed by modifying the process processes exemplified for the straight-profiled clip 60. Any of these types of clips can either be formed individually or in multiplicity on a single metal sheet by adapting the above-mentioned processes. Productivity in production of the clips can be increased by using a metal sheet to produce multiple chips.

Figure 13:
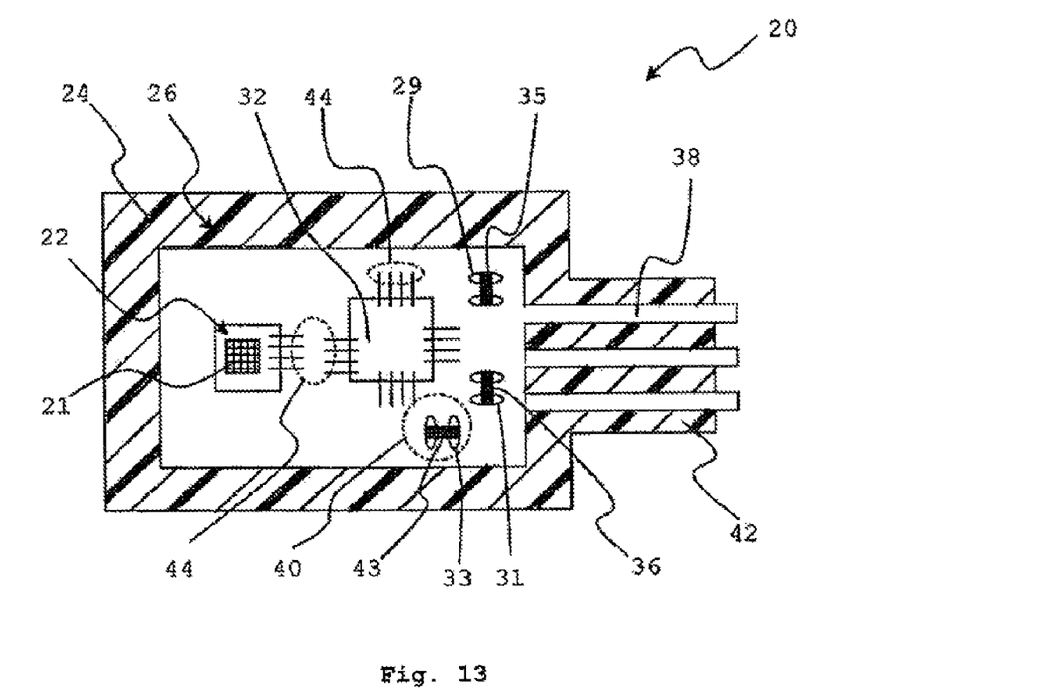
FIG. 13 illustrates an exposed top view of a further embodiment of a sensor unit.
Figure 14:
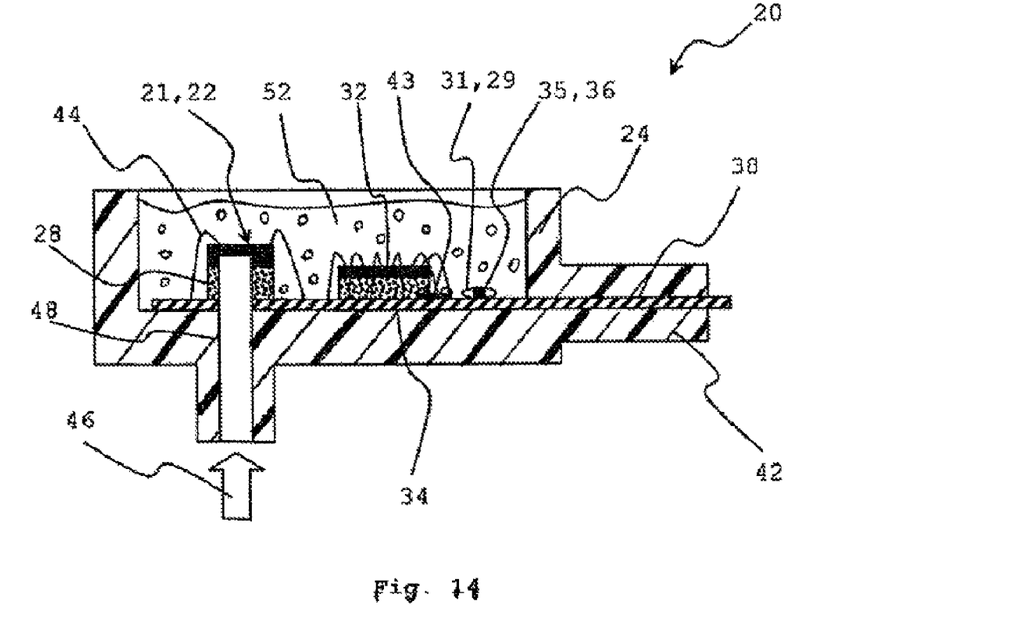
FIG. 14 illustrates an exposed side view of the sensor unit of FIG. 13.

FIG. 13 and FIG. 14 illustrate an exposed view of a further embodiment of a sensor unit 20. FIG. 13 illustrates a top exposed view of the sensor unit 20 whilst FIG. 14 depicts a side-exposed view of the sensor unit 20.

The sensor unit 20 is a type of electronic device 10, 20 with a sensing function. The sensor unit 20 includes a lead frame 26, a piezoresistive transducer (PRT) element 22 with a sensing diaphragm 21, a semiconductor chip 32, an ESD (electrostatic discharge) capacitor 35, a filter capacitor 36, a storage capacitor 43 and bond wires 44. The storage capacitor 43 is a ceramic type capacitor.

As can be better seen in FIG. 13, the lead frame 26 has a plurality of external contact leads 38 and a plurality of clips 29, 31, 33. The plurality of external contact leads 38 extends forwardly from a right side of the lead frame 26. The clips 29, 31, 33 extend from top of the lead frame 26. The lead frame 26 is enclosed by encapsulation compound 24, which can also be seen in FIG. 14. The encapsulation compound 24 envelops the leads 38 to form a connector 42 and a cavity on top of PRT element 22 as illustrated in FIG. 14. The encapsulation compound 24 encloses the PRT element 22, the semiconductor chip 32, the ESD capacitor 35, the filter capacitor 36, and the storage capacitor 43, except that the encapsulation compound 24 provides an opening 48 for the sensing diaphragm 21.

The PRT element 22, the semiconductor chip 32, the ESD capacitor 35, the filter capacitor 36, and the storage capacitor 43 are positioned on top of the lead frame 26. In particular, the semiconductor chip 32 is placed on top of a die pad of the lead frame 26. The die pad is not illustrated in FIG. 13 and FIG. 14. The clips 29 hold the ESD capacitor 35, the clips 31 secure the filter capacitor 36, and the clips 33 hold the storage capacitor 43. The clips 29, 31, 33 also electrically connect the lead frame 26 to terminals of the ESD capacitor 35, of the filter capacitor 36, and of the storage capacitor 43 respectively. For example, the storage capacitor 43 is clip fastened at its two terminals forming a clip fastened capacitor assembly 40.

The PRT element 22 and the semiconductor chip 32 are joined to the lead frame 26 by a plurality of bond wires 44. The PRT element 22 includes the sensing diaphragm 21.

As depicted in FIG. 14, a protective polymer gel 52 covers a top portion of the lead frame 26. The protective polymer gel 52 partly fills the cavity. The PRT element 22, the semiconductor chip 32, the ESD capacitor 35, the filter capacitor 36, and the storage capacitor 43 are covered by the protective polymer gel 52.

The protective polymer gel 52 has mechanical properties that allow the sensing diaphragm 21 to expand or contract, even though the protective polymer gel 52 covers the sensing diaphragm 21.

As illustrated in FIG. 14, the PRT element 22 is attached to the top surface of the lead frame 26 by a layer of die-attach polymer adhesive 28. Similarly, the semiconductor chip 32 is also attached to the top surface of the lead frame 26 by a layer of die-attach polymer adhesive 34. The sensing diaphragm 21 of the PRT element 22 is joined to a pressure intake channel 48, which is exposed to an external fluid 46. The external fluid 46 exert pressure onto the sensing diaphragm 21 via the pressure intake channel 48.

The capacitor 43 provides a non-interrupted electric power supply to the sensor unit 20. This can be illustrated by an example where the sensor unit 20 is a tire pressure sensor. The tire pressure sensor is typically installed inside the tire for continuous tire pressure monitoring. External power supply to the tire pressure sensor can be cut off when the tire experiences mechanical shocks due to speed humps or electromagnetic interferences. The external power supply can also be disconnected when the car is in a parking mode. The continuous sensing of tire pressure is useful for preventing potential traffic accidents due to a punctured or deflated tire.

Some examples of alternatives and the equivalents of the above embodiment illustrated in FIG. 13-14 are provided in the following.

The PRT element 22 and the semiconductor chip 32 may form an integral single unit. Locking structures are formed by the clip 29 together with the ESD capacitor 35, the clip 31 together with the filter capacitor 36, and the clip 33 together with the storage capacitor 43. The clip 29 may also exert a frictional force for fastening the ESD capacitor on the lead frame.

The sensor unit 20 may also include a combination of any of an ESD capacitor, an EMI capacitor, a filter capacitor and a storage capacitor. The filter capacitor 36, the ESD capacitor 35, and the storage capacitor 43 are examples of a capacitor or a passive electronic component.

The filter capacitor 36, the ESD capacitor 35, and the storage capacitor 43 are different forms of a passive component. The passive component can be in a form of a power storage unit. The arms 56, 64 of the first curve-profiled clips 66 are a form of two biasing arms. A first biasing arm 56 and a second biasing arm 64 can be each or together termed as a biasing element. The piezo-resistive transducer (PRT) element 22 is a type of a transducer. The transducer is a device, usually electrical, electronic, electromechanical, electromagnetic, photonic, or photovoltaic that converts one type of energy to another for various purposes, including measurement or information transfer.

In one embodiment, a single biasing arm together with the passive electronic component provides a locking structure. The mouth portion of the first curve-profiled clip 66 eases insertion of the passive electronic component into the first curve-profiled clip 66. A profile of the biasing arm conforms to a profile of the passive electronic component for providing reliable electrical and mechanical contacts. The surface of the biasing arm is treated to increase friction, to prevent corrosion or to enhance the electrical contact. The treatment can be a roughening or a coating of the surface of the biasing arm. The biasing arm is a form of a fastening means in the above-described embodiment.

The sensor unit 20 is intended for measuring pressure of the external fluid 46, which can be a gas, a liquid, or a mixture of gas and liquid.

The sensing diaphragm 21 has an electrical resistance that varies with displacements of the sensing diaphragm 21, such as expansions or contractions. The displacements vary with pressure exerted by the external fluid 46 onto the sensing diaphragm 21.

The PRT element 22 converts electrical resistance variations of the sensing diaphragm 21 to electrical signals for further processing by the semiconductor chip 32.

The bond wires 44 join both the PRT element 22 and the semiconductor chip 32 to the lead frame 26 in a predetermined manner in order to form an electronic device.

The semiconductor chip 32 processes the electrical signals received from the PRT element 22, and the semiconductor chip 32 communicates the processed electrical signals to other external electronic devices via the leads 38. The connector 42 provides suitable mechanical coupling to the other external electronic devices. The external electronic devices are not illustrated in both FIG. 13 and FIG. 14.

The ESD capacitor 35, the filter capacitor 36, and the storage capacitor 43 assist in proper functioning of the sensing unit 20. The ESD capacitor 35 offers immunity against electro-static discharge. The ESD capacitor 35 may be replaced by an EMI (Electro-Magnetic Interference) capacitor to suppress electromagnetic interference. A filter capacitor 36 assists the sensor unit 20 to activate at low energy. A storage capacitor 43 provides backup power to the sensor unit 20 in the absence of external power supply.

The encapsulation compound 24 is provided for enclosing the lead frame 26, the PRT element 22, the semiconductor chip 32, the ESD capacitor 35, the filter capacitor 36, the storage capacitor 43, and the lead fingers. The encapsulation compound 24 is further provided for holding the enclosed components such that the enclosed components form the sensor unit 20. The encapsulation compound 24 is also provided for preventing the enclosed components from external harms, such as vibration, electromagnetic radiation, heat and moisture, etc.

Various types of clips can be used for securing the storage capacitor 43, the ESD capacitor 35, and the filter capacitor 36 to the lead frame 26. Some examples are given in the description based on FIGS. 5-10. The configurations of the exemplified clips can be modified and combined for securing a single capacitor or multiple capacitors.

For assembly of the sensor unit 20, the following is done. The lead frame 26 with a substrate is provided. The semiconductor chip 32 and the PRT element 22 are then mounted onto the substrate. Later, the bond wires 44 are connected between the semiconductor chip 32 and the substrate as well as between the PRT element 22 and the substrate. The capacitors 35, 36, 43 are clip-fastened to the lead frame 26 respectively. After this, the lead frame 26 is covered with the encapsulation compound 24 by molding. The connector 42 is also formed by the molding. Molded encapsulation compound 24 has an opening that exposes the semiconductor chip 32, the PRT element 22 and the capacitors 35, 36, 43. Tie bars, which holds the clips 29, 31, 33 to the lead frame 26 are then cut off. The top of the PRT element 22 is afterwards covered with the protective gel 52.

Figure 15:
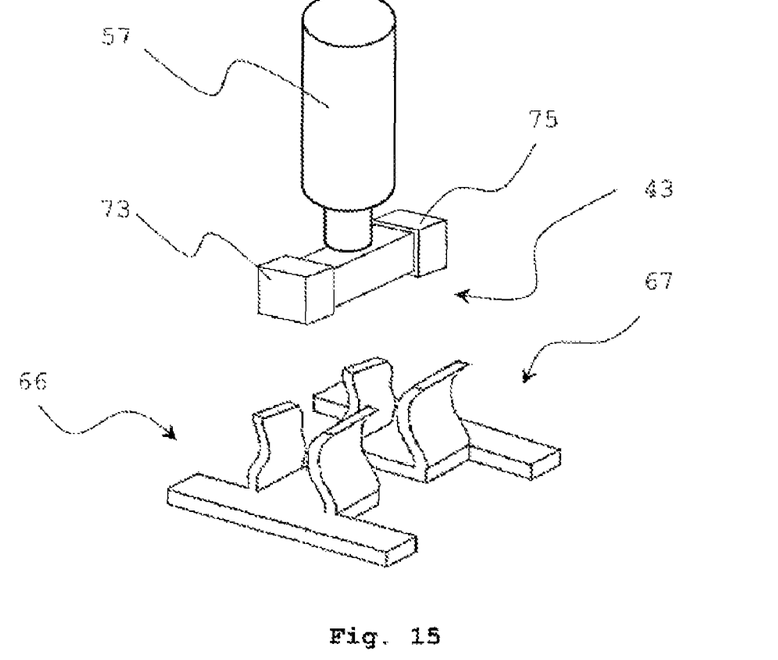
FIG. 15 illustrates a pickup tool in a process of lifting up the storage capacitor and inserting the storage capacitor into the clips.
Figure 16:
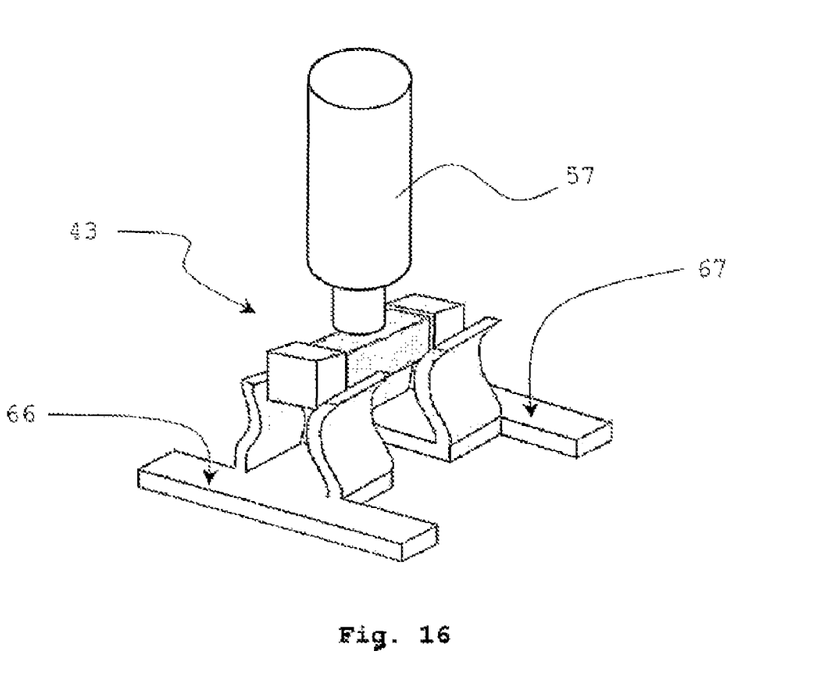
FIG. 16 illustrates the pickup tool in a process of inserting the storage capacitor into the clips.
Figure 17:
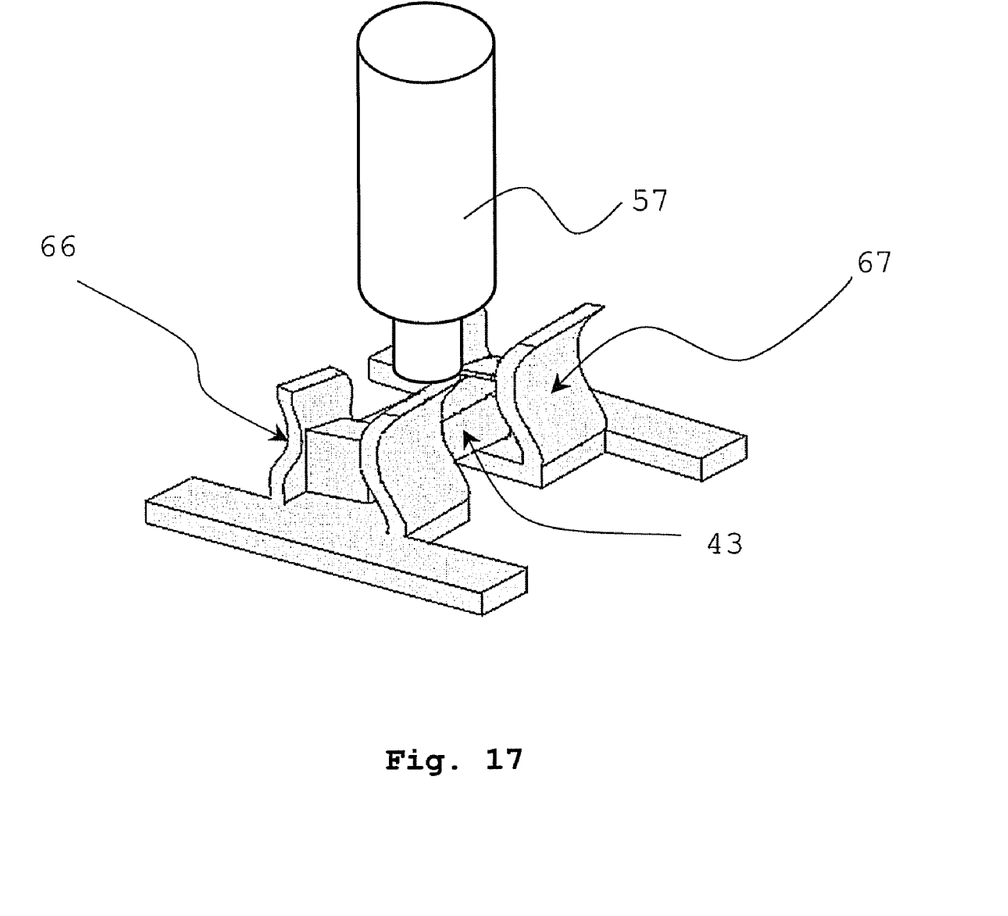
FIG. 17 illustrates the pickup tool of in a process of departing from the clips.

In particular, a process of clip-fastening the storage capacitor 43 is illustrated in relation to FIG. 15-17.

Firstly, a pickup tool 57 lifts the storage capacitor 43 and positions the storage capacitor 43 for insertion into the pair of curve-profiled clips 66, 67, as illustrated in FIGS. 5-7. The pick up tool 57 is located on top of the pair of curve-profiled clips 66, 67. The storage capacitor 43 is sucked to a bottom of the pick up tool 57. The pick up tool 57 with the storage capacitor 43 is located above the pair of curve-profiled clips 66, 67 such that the cavities of the curve-profiled clips 66, 67 are aligned to the terminals 73, 75 of the storage capacitor 43.

The pick up tool 57 then lowers down the storage capacitor 43 and reaches the upper portions of the arms 53, 55, 56, 64, as illustrated in FIG. 15. The terminals 73, 75 of the storage capacitor 43 are provided at the mouth portions of the pair of curve-profiled clips 66, 67 and contiguous to the arms 53, 55, 56, 64.

The mouth portions of the curve-profiled clips 66, 67 guide the insertion when the terminals 73, 75 of the storage capacitor 43 touch and glide over the upper portions of the arms 53, 55, 56, 64 of the pair of curve-profiled clips 66, 67.

The arms 53, 55, 56, 64 of the curve-profiled clips 66, 67 are then forced apart as the terminals 73, 75 touches the neck portions of the curve-profiled clips 66, 67 in the process of insertion. The storage capacitor 43 passes the neck portions as the storage capacitor 43 is further pushed down by the pickup tool 57 until both the terminals 73, 75 of the storage capacitor 43 reach the bases 54. Resilient force of the arms 53, 55, 56, 64 then causes the arms 53, 55, 56, 64 to spring back to their original position and secures the storage capacitor 43. Thereafter, the pickup tool 57 releases the storage capacitor 43.

Later, the pick up tool 57 is detached from the storage capacitor 43 and the pickup tool 57 departs from the pair of curve-profiled clips 66, 67, as illustrated in FIG. 17. The storage capacitor 43 is left inside the chest portions of the pair of curve-profiled clips 66, 67. The pick up tool 57 then ascends and journeys back to a component storage place for picking up another capacitor or other electronic components.

The insertion of the storage capacitor 43 into the pair of curve-profiled clips 66, 67 may elastically deform or plastically deform the arms 53, 55, 56, 64, depending if the deformation exceed resilient range of the clips 66, 67.

The curve-profiled clip 66 eases an insertion of the terminal 75 of the capacitor 43 with a curved opening. The curved opening can be deformed for receiving various forms or sizes terminals. The deformation is resilient such that the biasing arms 56, 64 of the embodiment tightly hold the capacitor 43 in place even when the capacitor 43 is provided in a vibrating environment. This thereby provides electrical connections to the capacitor 43 are robust.

Although the above description contains much specificity, these should not be construed as limiting the scope of the embodiments but merely providing illustration of the foreseeable embodiments. Especially the above stated advantages of the embodiments should not be construed as limiting the scope of the embodiments but merely to explain possible achievements if the described embodiments are put into practice. Thus, the scope of the embodiments should be determined by the claims and their equivalents, rather than by the examples given.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device comprising:
   a lead frame comprising a mounting base and at least one clip integrally formed with the lead frame;
   a capacitor comprising at least one terminal, the at least one terminal being received in the at least one clip;
   a semiconductor chip attached to the lead frame;
   a transducer for sensing an environmental parameter, the transducer being electrically connected with the semiconductor chip, wherein the transducer comprises a piezoresistive transducer (PRT) element for pressure sensing, the PRT element including a sensing diaphragm;
   an encapsulation compound enclosing the PRT element, the semiconductor chip and the capacitor, wherein the encapsulation compound has an opening therein to expose the sensing diaphragm; and
   wherein the PRT element, the semiconductor chip and the capacitor are situated on a top side of the lead frame, and wherein the encapsulation compound forms a cavity having a polymer gel therein covering the PRT element, the semiconductor chip and the capacitor.

2. The integrated circuit device of claim 1, wherein the at least one clip and the capacitor provide a locking structure.

3. The integrated circuit device of claim 1, wherein the at least one clip exerts a frictional force for fastening the capacitor on the lead frame.

4. The integrated circuit device of claim 1, wherein the at least one clip comprises two biasing arms, the two biasing arms resiliently fasten the capacitor to the lead frame.

5. The integrated circuit device of claim 4, wherein the two biasing arms of the at least one clip comprise upper portions, the upper portions of the at least one clip curve away from each other such that the upper portions of the at least one clip form mouth portions, the mouth portion comprising a gap comprising a width wider than the width of the at least one terminal of the capacitor.

6. The integrated circuit device of claim 5, wherein the biasing arms of the at least one clip further comprise neck portions adjacent to the mouth portions respectively, the neck portions comprising gaps having a width narrower than the width of the at least one terminal of the capacitor.

7. The integrated circuit device of claim 4, wherein the two biasing arms of the at least one clip comprise a roughened surface.

8. An electronic device comprising:
   a lead frame comprising a mounting base and at least one clip integrally formed with the lead frame, the at least one clip comprising at least one biasing element;
   a passive electronic component, the at least one clip electrically connecting and mechanically fastening the passive electronic component to the lead frame; and
   a semiconductor chip, the semiconductor chip being electrically connected with the lead frame
   a transducer for sensing an environmental parameter, the transducer being electrically connected with the semiconductor chip, wherein the transducer comprises a piezoresistive transducer (PRT) element for pressure sensing, the PRT element including a sensing diaphragm;

an encapsulation compound enclosing the PRT element, the semiconductor chip and the passive electronic component, wherein the encapsulation compound has an opening therein to expose the sensing diaphragm; and wherein the PRT element, the semiconductor chip and the passive electronic component are situated on a top side of the lead frame, and wherein the encapsulation compound forms a cavity having a polymer gel therein covering the PRT element, the semiconductor chip and the passive electronic component.

9. The electronic device of claim 8, wherein at least one biasing element comprises a first biasing arm being integrally formed with the lead frame.

10. The electronic device of claim 9, wherein at least one biasing element further comprises a second biasing arm, the second biasing arm being integrally formed with the lead frame, the second biasing arm and the first biasing arm being arranged to clip fasten the passive electronic component on the lead frame.

11. The electronic device of claim 9, wherein the at least one clip further comprises a stopper being integrally formed with the lead frame, the stopper and the first biasing arm being arranged to clip fasten the passive electronic component on the lead frame.

12. The electronic device of claim 8, wherein the at least one passive electronic component comprises a storage unit for storing electric energy.

13. The electronic device of claim 12, wherein the storage unit comprises a capacitor.

14. A method of producing an electronic device, the method comprising the steps of:
providing a lead frame, the lead frame comprising a mounting base and a clip with two biasing arms integrally formed with the lead frame;
providing a semiconductor chip on the lead frame;
inserting a capacitor into the clip;
electrically connecting a transducer for sensing an environmental parameter with the semiconductor chip, wherein the transducer comprises a piezoresistive transducer (PRT) element for pressure sensing, the PRT element including a sensing diaphragm; and
encapsulating the PRT element, the semiconductor chip and the capacitor with an encapsulating compound such that the encapsulation compound has an opening therein to expose the sensing diaphragm, wherein the PRT element, the semiconductor chip and the capacitor are situated on a top side of the lead frame, and wherein the encapsulation compound forms a cavity; and
providing a polymer gel in the cavity in the encapsulation compound that covers the PRT element, the semiconductor chip and the capacitor.

15. The method of claim 14, wherein the step of inserting the capacitor comprises the step of deforming a part of the clip.

16. The method of claim 15, wherein the step of deforming the part of the clip comprises the step of widening a neck portion of the clip.

17. A method of producing an electronic device comprising the steps of:
providing a lead frame with a mounting base and at least one clip integrally formed with the lead frame, the at least one clip comprising at least one biasing element,
providing a semiconductor chip on the lead frame,
inserting a passive electronic component into the at least one clip;
electrically connecting a transducer for sensing an environmental parameter with the semiconductor chip, wherein the transducer comprises a piezoresistive transducer (PRT) element for pressure sensing, the PRT element including a sensing diaphragm;
encapsulating the PRT element, the semiconductor chip and the passive electronic component with an encapsulating compound such that the encapsulation compound has an opening therein to expose the sensing diaphragm, wherein the PRT element, the semiconductor chip and the passive electronic component are situated on a top side of the lead frame, and wherein the encapsulation compound forms a cavity; and
providing a polymer gel in the cavity in the encapsulation compound that covers the PRT element, the semiconductor chip and the passive electronic component.

18. The method of claim 17, wherein the step of inserting a passive electronic component into the at least one clip comprises the step of deforming a part of the at least one clip.

19. The method of claim 17 wherein the step of deforming the part of the at least one clip comprises the step of widening a neck portion of the at least one clip.

* * * * *